United States Patent

Kaya et al.

Patent Number: 5,858,839
Date of Patent: Jan. 12, 1999

[54] METHOD OF MAKING EPROM CELL ARRAY USING N-TANK AS COMMON SOURCE

[75] Inventors: Cetin Kaya, Dallas; Kemal Tamer San, Plano, both of Tex.

[73] Assignee: Texas Instruments Incorporated, Dallas, Tex.

[21] Appl. No.: 752,092

[22] Filed: Nov. 20, 1996

[51] Int. Cl.$^6$ ............................................. H01L 21/8247
[52] U.S. Cl. ..................... 438/257; 438/262; 438/528
[58] Field of Search .................................. 438/211, 257, 438/262, 263, 264, 528

[56] References Cited

U.S. PATENT DOCUMENTS

| | | | |
|---|---|---|---|
| 5,019,527 | 5/1991 | Ohshima et al. . | |
| 5,350,706 | 9/1994 | McElroy et al. | 438/262 |
| 5,411,908 | 5/1995 | Santin et al. | 438/263 |

*Primary Examiner*—Chandra Chaudhari
*Attorney, Agent, or Firm*—Theodore D. Lindgren; Robby T. Holland; Richard L. Donaldson

[57] ABSTRACT

This invention provides a cost-effective, easy-to-integrate Flash EPROM cell array. Starting with a substrate (31) of first conductivity-type, a first diffusion (30) of second conductivity-type forms the sources (11), and the connections between sources, of all of the memory cells (10) of the array. A second diffusion (32) of first conductivity-type forms the channel of at least one memory cell (10) in the array. A floating gate (13) and a control gate (14) of that memory cell (10) are located over, and insulated from, a junction of the first diffusion and the second diffusion. A third diffusion (33) of second conductivity-type is isolated in the second diffusion (32) to form the drain (12) of the memory cell (10). During operation, only positive voltages may be used for programming and erasing of the cells (10), thus eliminating the need for negative voltages and for triple-well diffusions. The cell array of this invention requires little or no current for Fowler-Nordheim erase operation. Therefore, there is no need for wordline (15) decoding of large arrays. In addition to the above features, use of the cell array of this invention saves space by eliminating, in certain types of prior-art arrays, the need for space-consuming columnar metal source lines. In that same type of array, a self-aligned-source etch step and a self-aligned-source implant step are eliminated.

8 Claims, 4 Drawing Sheets

METHOD OF MAKING EPROM CELL ARRAY USING N-TANK AS COMMON SOURCE

BACKGROUND OF THE INVENTION

This invention relates to flash electrically-erasable, programmable read-only memories (Flash EPROMs) and to a method for making such integrated-circuit devices. In particular, this invention relates to a structure and a method for forming an array of EPROM cells.

One conventional structure for memory arrays of the type used herein is described, for example, in U.S. Pat. No. 5,019,527. In prior-art Flash EPROMs of the type described in exemplary U.S. Pat. No. 5,019,527, a horizontal source line connects to the sources of each memory cell in a row of an array of such memory cells. The term "array", as used herein, includes a subarray of several such subarrays on a chip. To flash erase of all of the memory cells in an array, a positive voltage is applied to the common source electrode for that array. With separate common source electrodes for subarrays, each of the subarrays may be erased separately from other subarrays on the chip.

The buried horizontal source lines of the foregoing prior-art arrays are formed by etching through vertical field oxide insulators. The horizontal source lines are formed in alternate spaces between the wordline/floating-gate stacks, with the stacks serving as masking for the self-aligned etching step.

The buried horizontal source lines are connected together by metal vertical source lines, so that all of the sources of the memory cells in an array are connected to a common electrode. Each metal vertical source line typically requires a space equivalent to about one and one-half columns of memory cells. The vertical source lines are placed at suitable intervals of columns of cells to compensate for the relatively high resistance of the buried horizontal source lines.

There is a need for a cost-effective, easy-to-integrate Flash EPROM structure that retains the advantages of the first prior-art structure described above, yet eliminates the need for space-consuming vertical source lines. In addition, there is a need for a Flash EPROM structure that decreases the number of steps for manufacturing the type of memory array described above.

SUMMARY OF THE INVENTION

This invention provides a cost-effective, easy-to-integrate Flash EPROM cell for use in memory arrays. Starting with a substrate of first conductivity-type, a first diffusion of second conductivity-type forms the sources, and the connections between sources, of all of the memory cells in at least a subarray. A second diffusion of first conductivity-type forms the channels of the memory cells in that subarray. A floating gate and a control gate of that memory cell are located over, and insulated from, a junction of the first diffusion and the second diffusion. A third diffusion of second conductivity-type forms the drains of the memory cells. The third diffusion is isolated from the first diffusion by the second diffusion.

The method uses shallow logic tanks of current technology, without introducing additional tanks. Construction does not necessarily require use of a high-energy tank drive, thus eliminating any requirement for an implanter with megavolt-energy-implant capability for forming diffusions on an epitaxial substrate. During operation, only positive voltages may be used for programming and erasing of the cell array, thus eliminating requirements both for negative voltages and for triple-well diffusions. That is, the cell array is programmable with channel-hot-electrons using positive voltages and is erasable using Fowler-Nordheim tunneling using positive voltage. The cell array of this invention requires little or no current for Fowler-Nordheim erase operation. Therefore, when used for large arrays or subarrays, there is no need for wordline decoding to flash-erase one array, or subarray, at a time. In the following discussion, the term "array" as is defined to mean either a complete array or a subarray of a complete array.

In addition to the above features, use of the cell array of this invention saves space by eliminating, in the type of nonvolatile memory described above, the need for space-consuming vertical source lines. In that same type of nonvolatile memory, use of the cell array of this invention eliminates a self-aligned, source-line etch step during fabrication.

The features of this invention eliminate a problem that arises when using trench isolation rather than LOCOS isolation to decrease the size of the memory. When using trench isolation, the horizontal source-lines have larger resistance because the source lines extend along the sides and bottom of the trenches. Because this invention does not require horizontal source lines, the larger-resistance problem is eliminated.

DETAILED DESCRIPTION OF THE INVENTION

Figure 1:
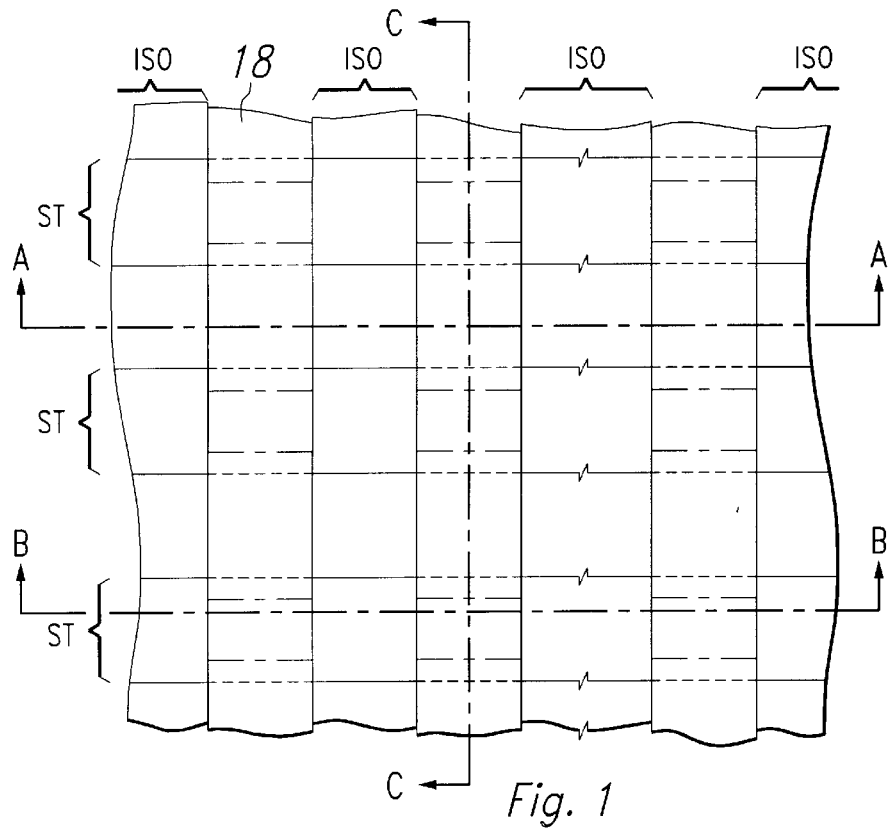
FIG. 1 is an enlarged plan view of a small part of a memory-array layout used with this invention, including the thick-field isolation regions.

Referring to FIG. 1, an example of a memory-array layout is illustrated for the purpose of describing this invention.

Figure 2A:
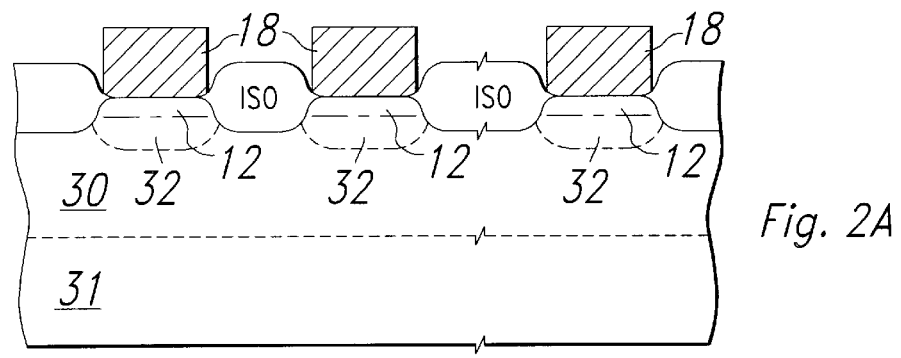
FIG. 2A is a cross-sectional view along lines A—A of FIG. 1, illustrating connection of drain-column lines to the drain regions of the floating-gate memory cells of the memory array as well as the continuous N-type diffusion that connects the sources of the memory cells.
Figure 2B:
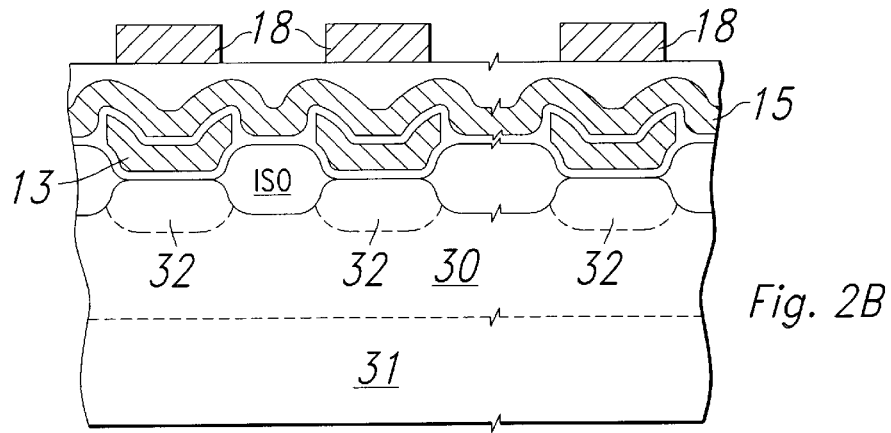
FIG. 2B is a cross-sectional view along lines B—B of FIG. 1, illustrating the relationship between the drain-column lines, the wordlines/control gates, and the floating gates as well as the continuous N-type diffusion that connects the sources of the memory cells.

FIGS. 2A and 2B illustrate thick-field isolation regions ISO that may be used as a part of a memory-array. In prior-art structures of the type considered here, the thick-field isolation regions ISO are thermally formed (or formed using a HIPOX, or LOCOS, method) as continuous columnar structures. While FIGS. 2A and 2B relate to thick-field isolation, this invention is not limited to LOCOS or similar isolation methods. For example, trench isolation may be used. As explained previously, during prior-art manufacturing procedures, the continuous LOCOS structures are etched using the wordline/floating-gate stack ST as a self-aligned mask. In those prior-art procedures, the etch is followed by an implant to form continuous source lines perpendicular to the thick-field isolation regions ISO and between alternate stacks ST.

Figure 2C:
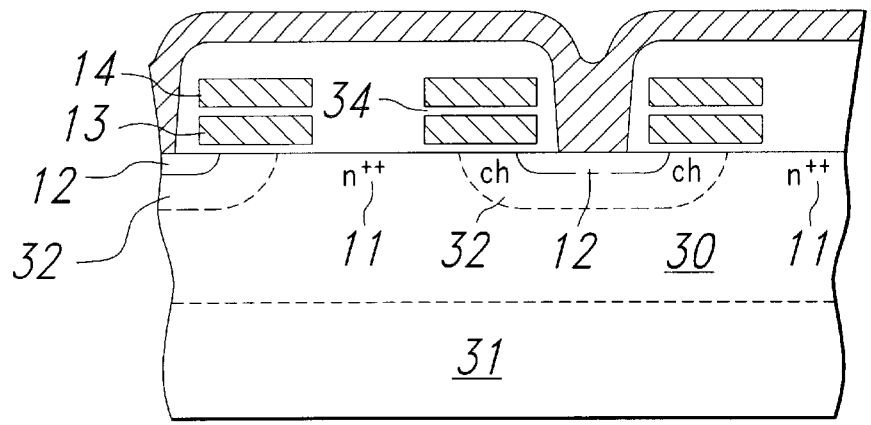
FIG. 2C is a cross-sectional view along lines C—C of FIG. 1, illustrating the P-type pocket-implants that form the channels between the sources and drains of the memory array and illustrating the continuous N-type diffusion that forms connects the sources of the memory cells.

Referring now to FIG. 2C, the advantages of this invention are realized by building an array of EPROM cells 10 using wells, or diffused regions, 30 of N conductivity-type formed in substrate 31 of P conductivity-type. The N conductivity-type wells 30 are formed by N-type implant, which may be phosphorous using a dosage of about 2.4× $10^{13}/cm^2$ at 100 KeV followed by conventional tank drive or anneal. Floating gates 13 are separated from the substrate 31 by a gate insulator 33. Control gates 14 are separated from floating gate 13 by inter-level insulators 34. Gates 13 and 14 are formed by well-known column-etch followed by stack-etch method. Floating gates 13, gate inter-level insulators 34 and control gates/wordlines 14 comprise stacks ST. After formation of stacks ST, pocket diffused regions 32 of P+ conductivity-type are formed by, for example, implanting boron using a dosage of about $1.5 \times 10^{14}/cm^2$ at 30 KeV followed by conventional anneal. Pocket diffused regions 32 include the channels CH of each cell 10. Drains 12 of each cell are implanted, for example, using arsenic at about $1.5 \times 10^{15}/cm^2$ at 80 KeV followed by conventional anneal, forming N conductivity-type drain 12 diffusions that are isolated from N-well 30 by pocket diffused regions 32. Optional source-region 11 implants of N+ conductivity-type are included in N-well 30. Those optional source-region 11 implants may be made at the same time that N conductivity-type implants for drain regions 12 are made, removing the necessity for a masking step.

The thick-field isolation regions ISO are illustrated in FIGS. 2A–2B as being formed after formation of N-well 30. Alternatively, N-wells 30 may be formed after formation of thick-field isolation regions ISO. If each column of cells 10 is formed in a separate N-well separated by thick-field isolation regions ISO, each column may be treated as a subarray for erasure purposes, or several columns may be connected by a metal line to form a larger subarray.

In the embodiment of FIG. 2C, the channel CH region of implant region 32 is left floating. That is, there is no hard contact between implant region 32 and any bias voltage supply tied to substrate 31. As discussed later herein, the lack of hard contact is believed to result in a lower saturation threshold voltage Vt.

Figure 3A:
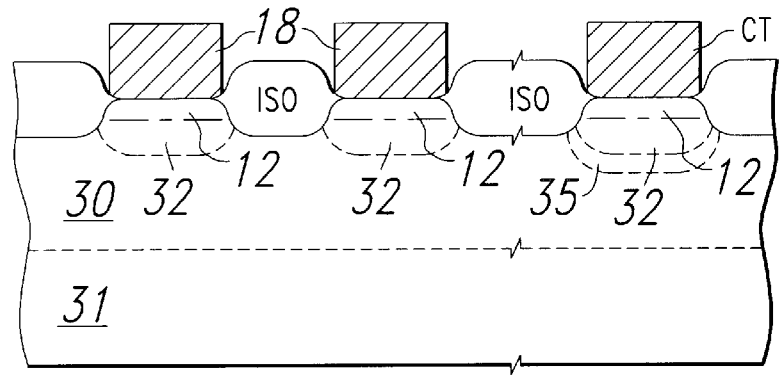
FIG. 3A is a cross-sectional view along lines A—A of a slightly modified FIG. 1, illustrating connection of P+ pockets, formed by an optional P+ pocket implant, by a metal line coupled to the substrate or to a bias voltage.

Referring now to FIG. 3A, a low saturation-threshold-voltage Vt problem is remedied by providing a ground path to the P+ pocket 32. Metal contacts CT, spaced every thirty-two or sixty-four columns, tie implanted P regions 35 to a common node. Implanted regions 35 are formed by a high-energy P-type implant step (approximately $3 \times 10^{13}/cm^2$ of boron). The combination of metal lines CT and implanted regions 35 increases the saturation threshold voltage Vt for deselected cells 10.

Figure 3B:
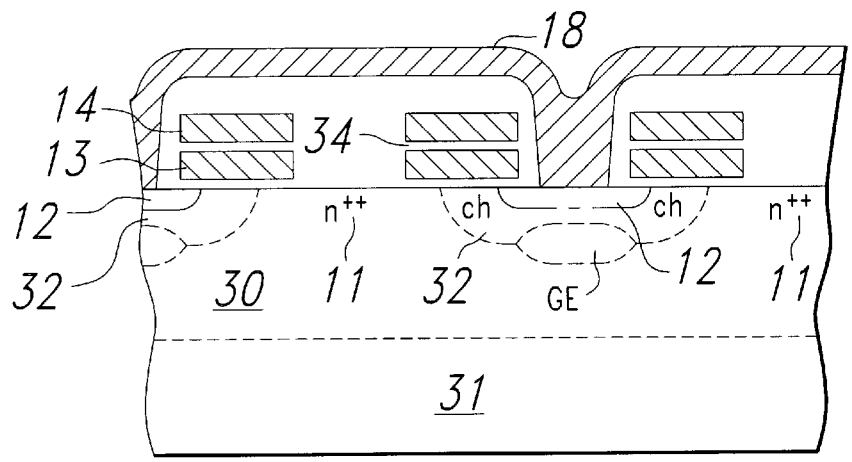
FIG. 3B is a cross-sectional view along lines C—C of FIG. 1, illustrating use of heterojunction engineering to increase the saturation threshold voltage.

FIG. 3B shows an alternative approach to the same problem. In this embodiment, the saturation threshold voltage Vt is kept high by implanting germanium GE at the P-pocket 32/N-well 30 interface. The implant GE may be in a range of about $1 \times 10^{15}/cm^2$ to $1 \times 10^{16}/cm^2$ at about 300 KeV to 1000 KeV. This is known to lower the hole barrier height and, therefore, to avoid the floating P-pocket effect.

The cells 10 of FIGS. 1 and 2A–2C are programmed, erased and read using the voltages of TABLE I, in which the gate voltage Vg, the drain voltage Vd and the source voltage Vs are measured with respect to the reference voltage Vss of substrate 31.

TABLE I

| Operation | Vg | Vd | Vs |
|---|---|---|---|
| Program | 10V | 5V | 0V |
| Erase | 0V | Float | 15V |
| Read | 5V | 1V | 0V |

Figure 4A:
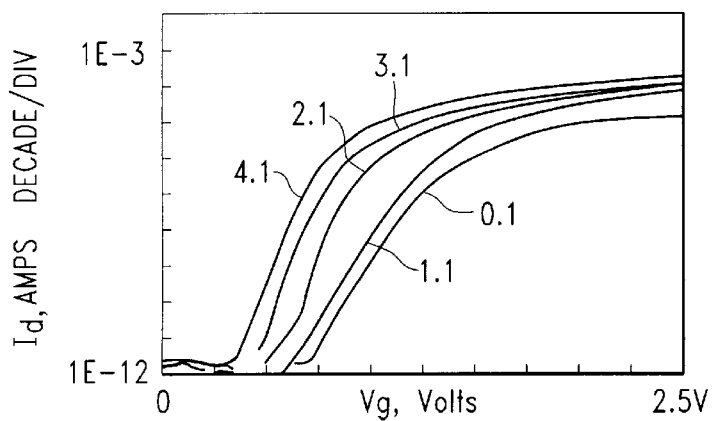
FIGS. 4A–4B compare the Id-Vd characteristics of the pocket cell of an embodiment of this invention with those of a standard prior-art cell built on the same wafer.
Figure 4B:
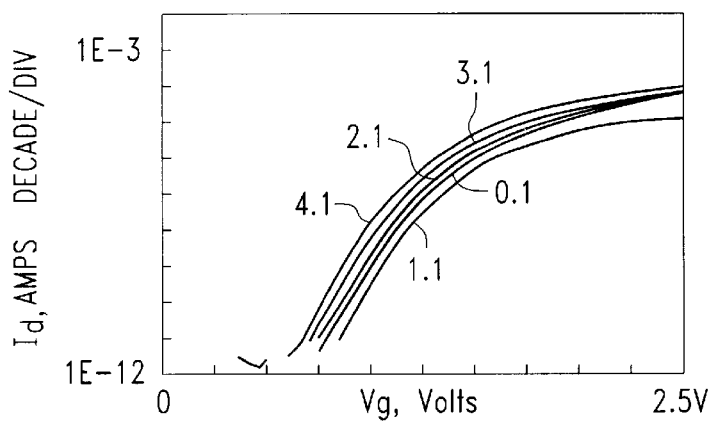

Referring now to FIGS. 4A–4B, the Id-Vd characteristics of the pocket cell 10 of this embodiment are compared with a standard prior-art cell built on the same wafer using voltages of 0.1, 1.1, 2.1, 3.1 and 4.1 on the drains 12.

Figure 5:
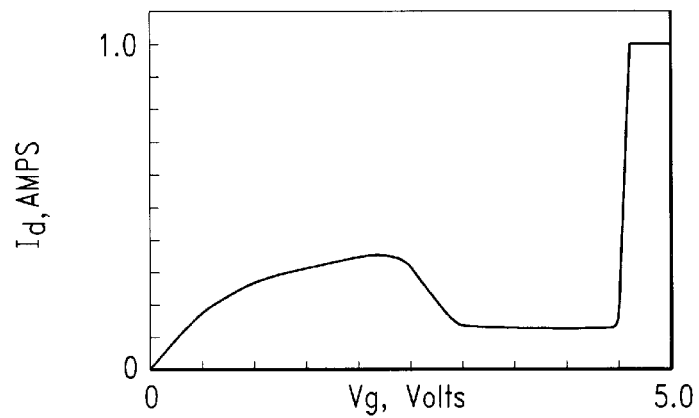
FIG. 5 illustrates one-shot programming characteristics.

FIG. 5 illustrates one-shot programming characteristics of the cell 10 of this invention.

Table II shows the programming characteristics of this type of cell.

TABLE II

| Vd | Vg | Time to program to 7.0V |
|---|---|---|
| 4.0V | 11.4V | 84.0 µs |
| 4.5V | 11.4V | 13.1 µs |
| 5.0V | 11.4V | 3.6 µs |

A drawback of memory arrays using the pocket cell 10 of this invention is a wider split in saturation and linear threshold voltages Vt during the BVDSS (Breakdown Voltage Drain-to-Source or -Substrate) mode (1.6V vs. 0.8V for standard FAMOS) as shown in FIGS. 4A–4B. One solution for this problem is to force the threshold voltage Vt population to a higher level. The higher level of threshold voltages Vt can be circumvented by biasing the sources 11 (diffused region 30) to approximately 0.5V during programming (with the control gates 14 grounded for deselected cells 10). For comparable programming time, this increases the bitline and wordline voltages by 0.5V. This is believed to be due to the floating P+ pocket 32, which couples to the drain 12 (or is charged by band-to-band tunneling current) and which goes positive, hence lowering the potential barrier at the source 11 side.

Insofar as the resistance of the N-well 30 permits, the above embodiments eliminate the horizontal source lines in certain prior-art structures and eliminate the metal vertical source lines connecting those horizontal source lines, thus saving the space on the chip required by the metal vertical source lines. Current flows through N-well 30 extending under cells 10 in an array, eliminating the prior-art need for cutting through the LOCOS region ISO to form horizontal source-lines that are connected to one or more vertical source lines. To compensate for N-well 30 resistance, several source terminal contacts are made through a N+ guard ring at the edges of the N-well 30 area. This results in a source resistance of approximately 1 sq N-well sheet (approximately 500 to 1000 ohms). It is also possible to lower the N-well sheet resistance by using MeV-type high energy implants. In addition to eliminating the horizontal source lines and metal vertical source lines, the self-aligned-source etch step and/or the self-aligned-source implant step are eliminated from the most commonly used Flash EPROM memory process.

Alternatively, the post-erase threshold voltage Vt distribution can be tightened by using well-known cell-by-cell type of compaction. That procedure may, of course, be used in addition to the procedures described above.

Figure 6:
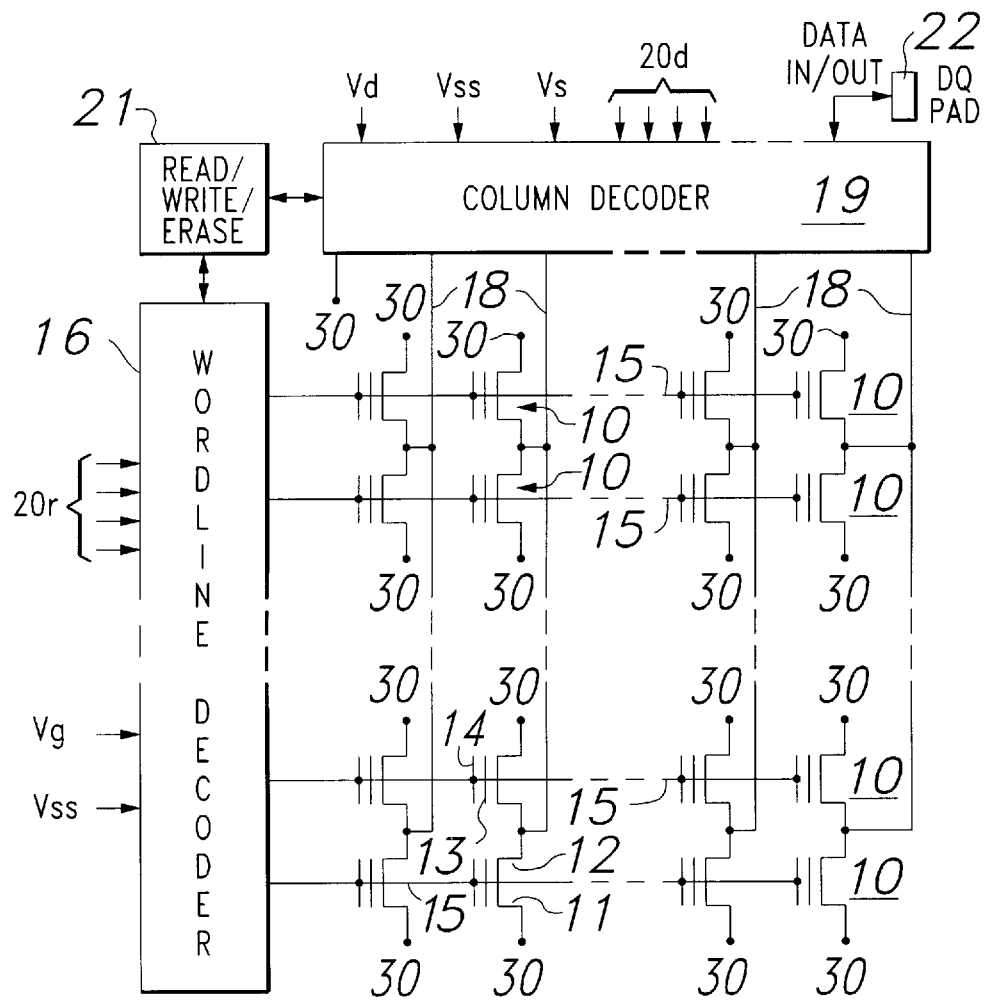
FIG. 6 is an electrical schematic diagram, in partial block form, of a memory cell array.

Referring to FIG. 6, an example array of memory cells, which is an integral part of a memory chip, is shown to illustrate use of this invention. Each cell is a floating-gate transistor 10 having a source 11, a drain 12, a floating gate 13, a control gate 14. Each of the control gates 14 in a row of cells 10 is connected to a horizontal wordline 15, and each of the wordlines 15 is connected to a wordline decoder 16. Each of the sources 11 of cells 10 is connected to decoder 19 through common N-well 30. Each of the drains 12 in a column of cells 10 is connected to a drain-column line 18, which connects to the column decoder 19.

In the read mode, the wordline decoder 16 functions, in response to wordline address signals on lines 20r and to signals from Read/Write/Erase control circuit 21 (or microprocessor 21), to apply a gate voltage Vg of about +5V to the selected wordline 15, and to apply a gate voltage Vg of 0V (ground or substrate voltage Vss) to deselected wordlines 15. The column decoder 19 functions to apply a drain voltage Vd of about +1V to the selected drain-column line 18 and to apply a source voltage Vs of 0V to the common N-well 30. The column decoder 19 also functions, in response to signal on address lines 20d, to connect the selected drain-column line 18 of the selected cell 10 to the DATA IN/OUT terminal. The conductive or non-conductive state of the cell 10 connected to the selected drain-column line 18 and the selected wordline 15 is detected by a sense amplifier (not shown) connected to the DATA IN/OUT terminal 22.

During a flash-erase mode, the column decoder 19 may function to leave all drain-column lines 18 floating (connected to a high impedance such as field-effect transistor biased in "OFF" condition). The wordline decoder 16 functions to connect all the wordlines 15 to a gate voltage Vg equal to 0V or substrate voltage Vss. The column decoder 19 also functions to apply a source voltage Vs of about +15V on all sources 11 by energizing N-well 30 at about +15V. These erasing voltages create sufficient field strength across the gate oxide region to generate a Fowler-Nordheim tunnel current that transfers charge from the floating gate 13, erasing the memory cell 10. Since the potential on each wordline 15 is 0V, the cell 10 remains in the non-conducting state during erase. For that reason, and because the drain 12 is floated, no channel-hot carriers are generated.

In a write or program mode, the wordline decoder 16 may function, in response to wordline address signals on lines 20r and to signals from Read/Write/Erase control circuit 21, (or microprocessor 21) to place a gate voltage Vg of about +10V on a selected wordline 15, including a selected control-gate 14. Optionally, Read/Write/Erase control circuit 21, (or microprocessor 21) may place a negative voltage of about −1V or −2V on the wordlines of deselected cells to circumvent the floating P+ pocket 32 effect. Column decoder 19 also functions to place a drain voltage Vd of about +5 on a selected drain-column line 18 and, therefore, the drain 12 of selected cell 10. A source voltage Vs of 0V, or substrate voltage Vss, is placed on all source 11 through common N-well 30. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2V to −6V with respect to the channel region (with Vg at 0V). For memory cells 10 fabricated in accordance with the example embodiment, the coupling coefficient between a control gate 14/wordline 15 and a floating gate 13 is approximately 0.6. Therefore, a programming gate voltage Vg of 10V, for example, on a selected wordline 15, including the selected control gate 14, places a voltage of approximately +6V on the selected floating gate 13. The voltage difference between the floating gate 13 (at approx. +6V) and the grounded (approx. 0v) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 non-conductive with a positive read voltage on control gate 14, a state that is optionally read as a "zero" bit. Deselected cells 10 have source-drain paths under the floating gate 13 that remain conductive, and those cells 10 are optionally read as "one" bits.

While this invention has been described with respect to illustrative embodiments, this description is not intended to be construed in a limiting sense. Upon reference to this description, various modifications of the illustrative embodiments, as well as other embodiments of the invention, will be apparent to persons skilled in the art. It is contemplated that the appended claims will cover any such modifications or embodiments that fall within the scope of the invention.

What is claimed is:

1. A method for forming nonvolatile memory cells in an array of said cells on substrate of first conductivity-type, said method comprising:

forming a first diffused region of second conductivity-type in said substrate, said first diffused region including the sources, and the connections between sources, of all of said memory cells in said column;

forming at least one second diffused region of first conductivity-type, said second diffused region in said first diffused region, said second diffused region including the channel of at least one memory cell in said array;

forming a floating gate and a control gate of said at least one memory cell over, and insulated from, a junction of said first diffused region and said second diffused region; and forming at least one third diffused region of said second conductivity-type, said third diffused region formed using said floating gate and said control gate as a mask, said third diffused region isolated in said second diffusion to form the drain of said at least one memory cell.

2. The method of claim 1, wherein said first diffused region is formed using MeV-type implants to lower sheet resistance.

3. The method of claim 1, further including a second implant of said second conductivity-type in said sources.

4. The method of claim 1, further including forming a conductive path between said second diffused region and said substrate.

5. The method of claim 1, further including implanting germanium at a junction of said first diffused region and said second diffused region.

6. The method of claim 1, wherein said first diffusion is biased at about +0.5V with respect to said substrate during programming operation of said array.

7. The method of claim 1 further including at least a second memory cell, wherein a thick-field insulator is formed on said substrate to isolate said second memory cell from said first memory cell.

8. The method of claim 1 further including at least a second memory cell, wherein a trench is formed in said substrate to isolate said second memory cell from said first memory cell.

* * * * *